United States Patent
Ouyang et al.

(10) Patent No.: US 8,411,449 B2
(45) Date of Patent: Apr. 2, 2013

(54) ELECTRONIC DEVICE AND CONNECTION MECHANISM FOR TOUCH BUTTONS THEREOF

(75) Inventors: Kuo-Hsiang Ouyang, Taipei Hsien (TW); Hone-Wei Tang, Taipei Hsien (TW); Chung-Ding Wang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 222 days.

(21) Appl. No.: 12/954,539

(22) Filed: Nov. 24, 2010

(65) Prior Publication Data

US 2012/0020031 A1 Jan. 26, 2012

(30) Foreign Application Priority Data

Jul. 22, 2010 (CN) .......................... 2010 1 0234147

(51) Int. Cl.
  *H05K 1/00* (2006.01)
  *H05K 1/18* (2006.01)
  *H05K 7/00* (2006.01)
  *H05K 5/00* (2006.01)
  *H01H 9/00* (2006.01)
(52) U.S. Cl. .................... 361/748; 361/752; 200/292
(58) Field of Classification Search .................. None
  See application file for complete search history.

(56) References Cited

U.S. PATENT DOCUMENTS

| 6,373,265 | B1 * | 4/2002 | Morimoto et al. | 324/686 |
|---|---|---|---|---|
| 6,680,731 | B2 * | 1/2004 | Gerpheide et al. | 345/173 |
| 6,894,507 | B2 * | 5/2005 | Morimoto | 324/661 |
| 7,476,952 | B2 * | 1/2009 | Vaganov et al. | 257/415 |
| 7,554,167 | B2 * | 6/2009 | Vaganov | 257/415 |
| 7,564,247 | B2 * | 7/2009 | Born et al. | 324/658 |
| 7,633,488 | B2 * | 12/2009 | Nishino et al. | 345/157 |
| 2004/0008038 | A1 | 1/2004 | Morimoto | |
| 2006/0266632 | A1 | 11/2006 | Jang | |
| 2007/0282208 | A1 * | 12/2007 | Jacobs et al. | 600/485 |
| 2008/0074398 | A1 * | 3/2008 | Wright | 345/173 |
| 2009/0111540 | A1 * | 4/2009 | Inoue et al. | 455/575.3 |
| 2009/0122510 | A1 * | 5/2009 | Stiehl et al. | 361/832 |
| 2009/0184920 | A1 * | 7/2009 | Francis | 345/156 |

FOREIGN PATENT DOCUMENTS

| CN | 1472519 A | 2/2004 |
|---|---|---|
| CN | 101777902 A | 7/2010 |
| JP | 7-78645 | 3/1995 |
| JP | 2006-330724 | 12/2006 |

* cited by examiner

*Primary Examiner* — Lisa Lea Edmonds
*Assistant Examiner* — Xanthia C Cunningham
(74) *Attorney, Agent, or Firm* — Altis Law Group, Inc.

(57) ABSTRACT

An electronic device includes a housing, a capacitive touch button, a PCB and a connection mechanism. The capacitive touch button is secured in the housing and includes a number of button bodies. The PCB is secured in the housing. The connection mechanism includes a circuit board and a connection element. The circuit board is secured in the housing and includes a number of sensor electrodes and a number of electrical protrusions, which are all arranged corresponding to the number of button bodies of the capacitive touch button. The sensor electrodes are connected to the capacitive touch button and the electrical protrusions. The connection element includes a first end and a second end. The first end is fixed on the PCB. The second end resists against the electrical protrusions for electrically connecting the capacitive touch button and the controller of the PCB.

8 Claims, 4 Drawing Sheets

ELECTRONIC DEVICE AND CONNECTION MECHANISM FOR TOUCH BUTTONS THEREOF

BACKGROUND

1. Technical Field

The present disclosure relates to an electronic device and a connection mechanism for touch buttons thereof.

2. Description of Related Art

Capacitive touch buttons are commonly used for electronic devices, such as mobile phones. Usually, a capacitive touch button includes a touch panel, a number of sensor electrodes, and a conductor layer. The touch panel includes a number of button areas corresponding to the sensor electrodes. When the user touches one button area, a coupling capacitance is formed between the finger of the user and the conductor layer. The current generated by the sensor electrodes flows through the conductor layer to the contacts of the buttons. A connector is employed to connect the induction layer and the main printed circuit board (PCB) of the electronic device. The signal of the current is transmitted to the controller of the electronic device on the PCB. The controller accounts the ratio and strength of the current according to the received signals, and determines the touch position and executes a preset function.

However, the connector is expensive and the assembly of the connector is inconvenient because the connector itself or other to-be-connected elements may obstruct joint parts.

Therefore, what is needed is an electronic device and a connection mechanism for touch buttons thereof alleviating the limitations described above.

BRIEF DESCRIPTION OF THE DRAWINGS

The components in the drawings are not necessarily drawn to scale, the emphasis instead being placed upon clearly illustrating the principles of an electronic device and a connection mechanism for touch buttons thereof. Moreover, in the drawings, like reference numerals designate corresponding parts throughout the several views.

DETAILED DESCRIPTION

Figure 1:
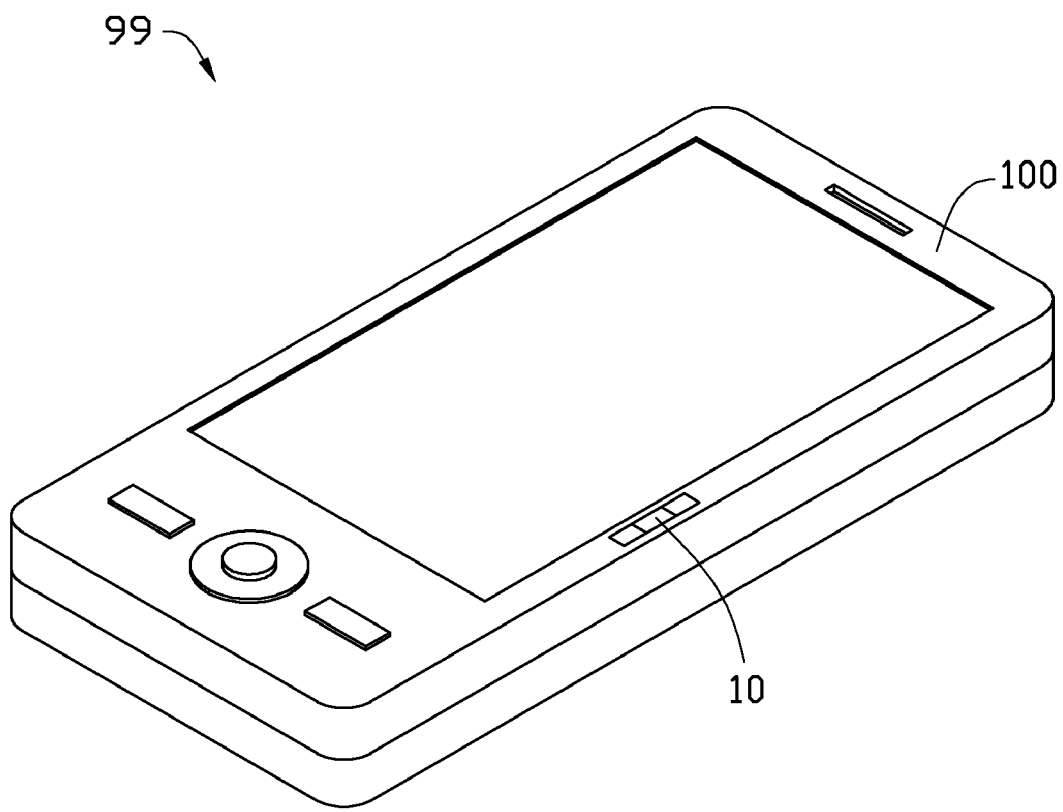
FIG. 1 is an isometric view of an exemplary embodiment of an electronic device and a connection mechanism for touch buttons thereof.

Referring to FIG. 1, an electronic device 99 is disclosed as an exemplary embodiment. The electronic device 99 includes a housing 100 and a capacitive touch button 10 secured in the housing 100. The capacitive touch button 10 includes a number of button bodies 110. In the embodiment, the number of the button bodies 110 is three, and the electronic device 99 is a mobile phone. In an alternative embodiment, the number of the button bodies 110 is determined according to need. The capacitive touch button 10 can adjust the volume of the mobile phone. In other embodiments, the electronic device 99 may be an MP3 player, or an electronic reader. The capacitive touch button 10 can page up and down, or control the directions of the cursor on a screen of the electronic device 99.

Figure 2:
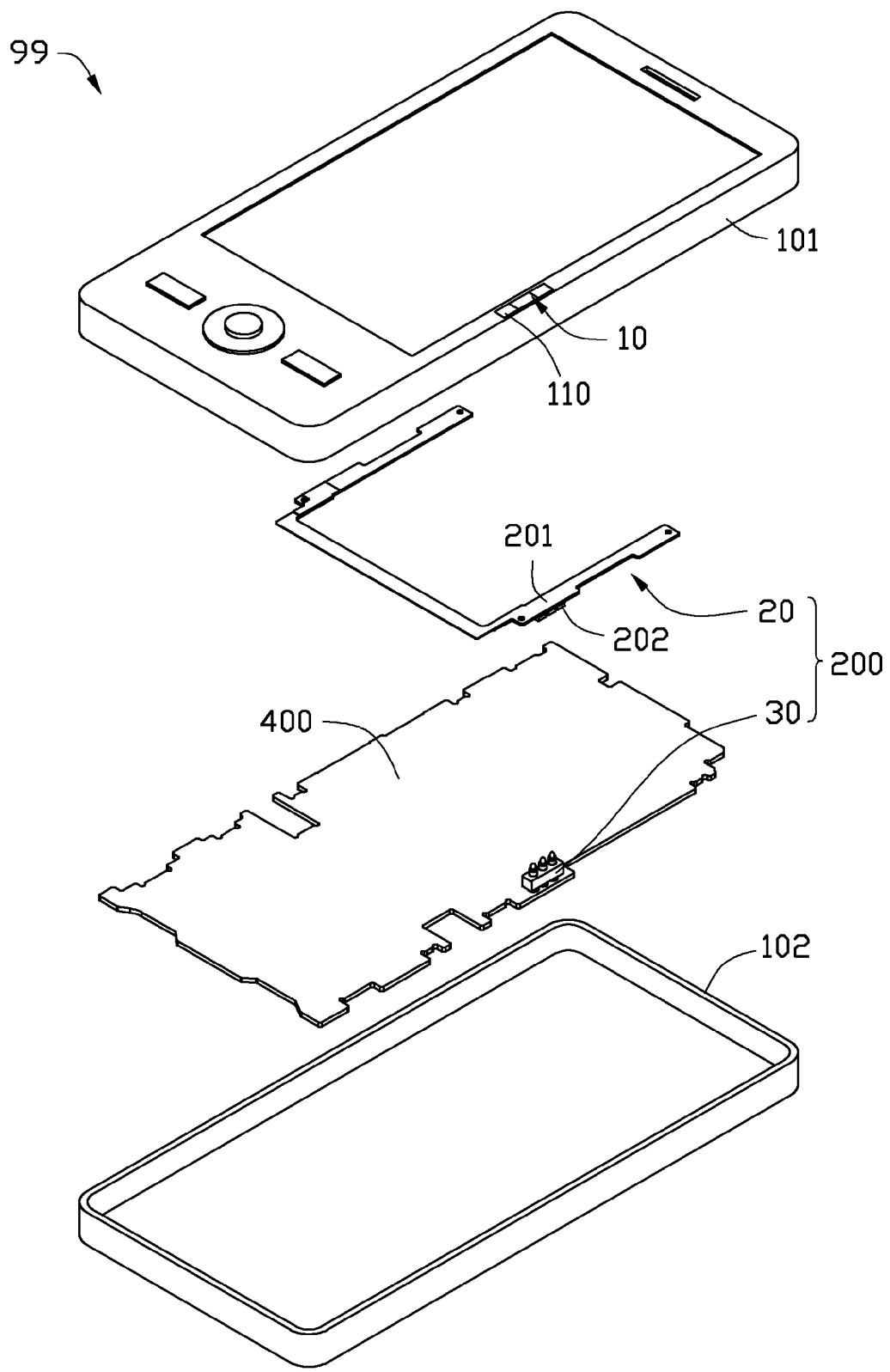
FIG. 2 is an exploded view of the electronic device of FIG. 1.
Figure 3:
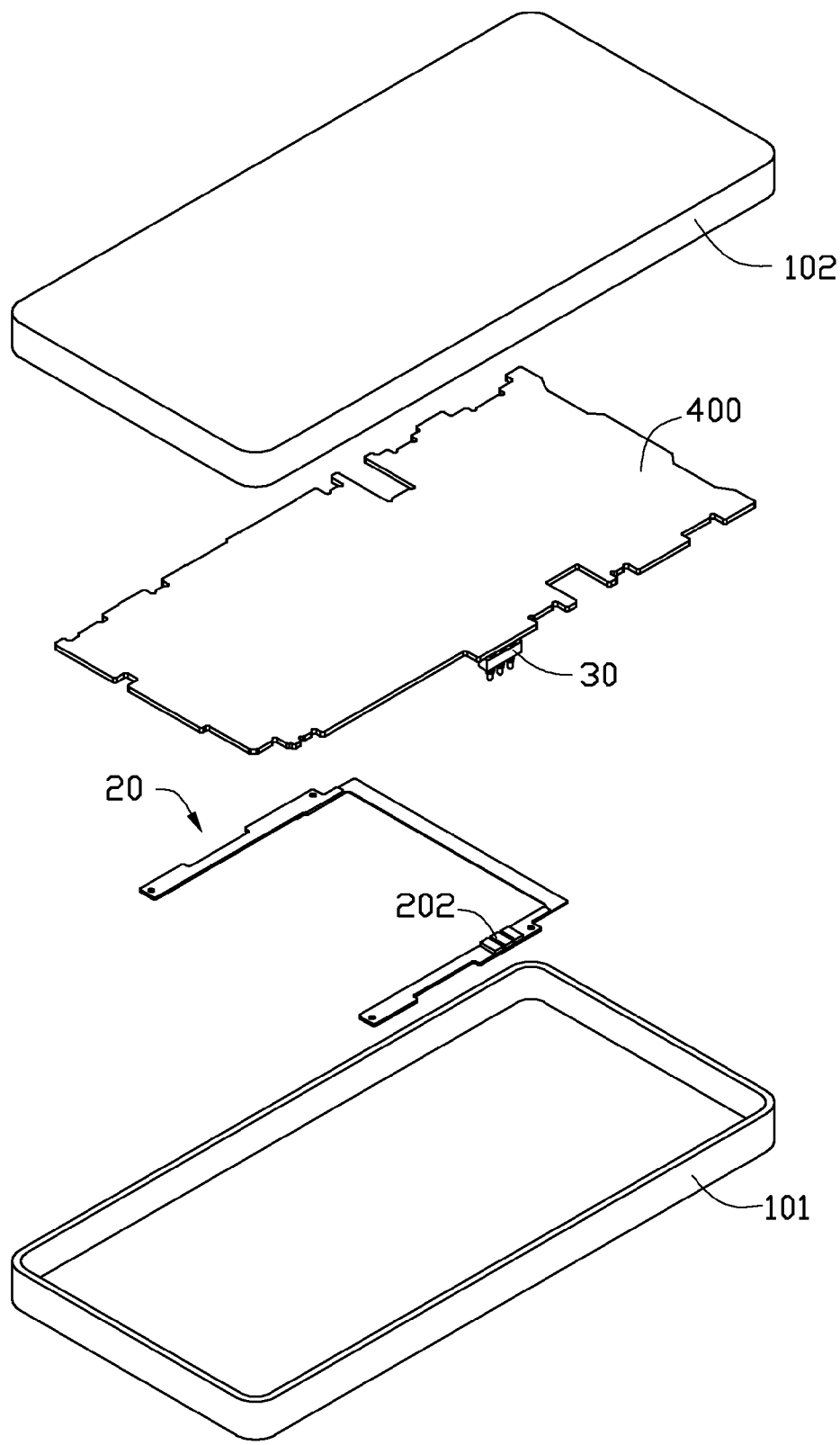
FIG. 3 is another exploded view of the electronic device of FIG. 1, viewed from another aspect.

Referring to FIGS. 2 and 3, the electronic device 99 further includes a connection mechanism 200 and a PCB 400. Both the connection mechanism 200 and the PCB 400 are secured in the housing 100. The housing includes an upper cover 101 and a lower cover 102.

The connection mechanism 200 connects the capacitive touch button 10 and a controller (not shown) of the PCB 400. The connection mechanism 200 includes a circuit board 20 secured on the inner surface of the upper cover 101 of the housing 100, and a connection element 30 fixed on the PCB 400. The circuit board 20 includes a number of sensor electrodes 201 and a number of electrical protrusions 202, which are all arranged corresponding to the arrangement of the button bodies 110 of the capacitive touch button 10. The electrical protrusions 202 are respectively connected to the sensor electrode 201 and are secured on the circuit board 20, opposing the PCB 400. In the embodiment, the electrical protrusions 202 are metallic solder pads. The number and location of the electrical protrusions 202 are respectively corresponding to that of the button bodies 110 of the capacitive touch button 10. The circuit board 20 may be a flexible circuit board or a hard circuit board.

Figure 4:
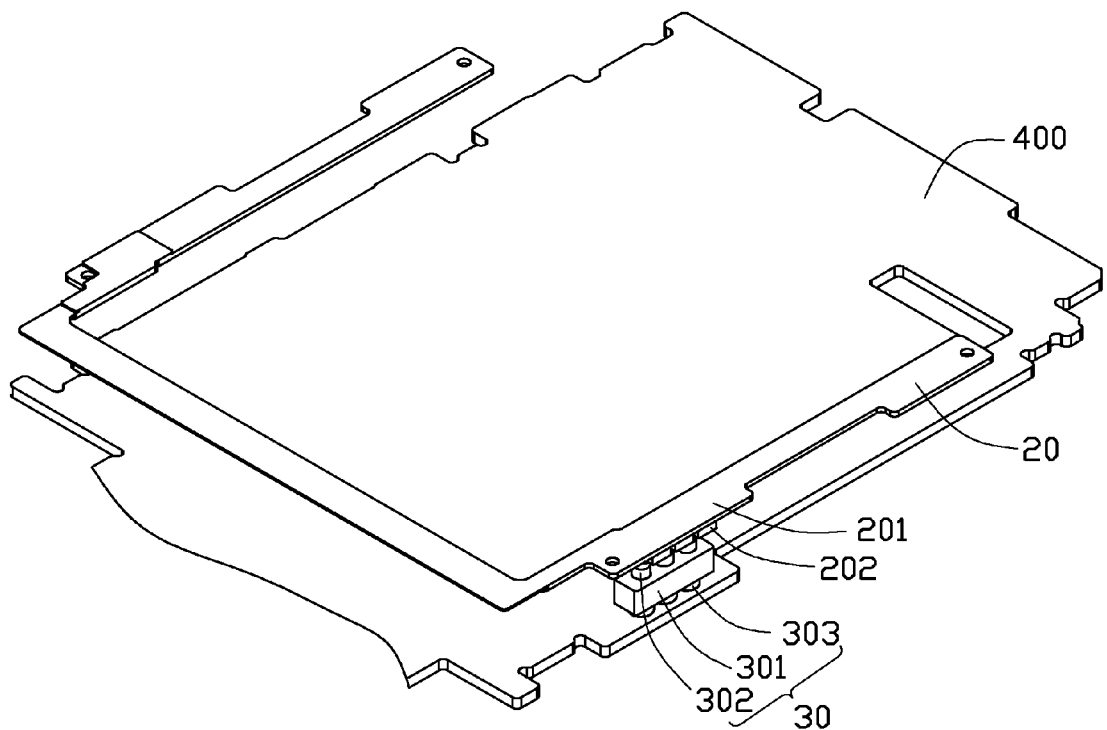
FIG. 4 is a partial, isometric view of the electronic device of FIG. 1, with a housing omitted for illustration clarity.

Referring to FIGS. 2 and 4, the connection element 30 includes a base 301, a number of first connection terminals 302 and a number of second connection terminals 303. The connection terminals 302 and 303 are arranged at opposite sides of the base 301. The first connection terminals 302 are elastic and can be elastically deformed when being pressed. The free ends of the first connection terminals 302 resist against the electrical protrusions 202 of the circuit board 20, and the other ends of the first connection terminals 302 are fixed to the base 301. One end of each second connection terminal 303 is fixed on the PCB 400 and the other end of each second connection terminal 303 passes through the base 301 and is connected to one of the first connection terminals 302. The first and second connection terminals 302, 303 are made of electrically conductive materials, and the number of the first and second connection terminals 302, 303 is the same as the buttons of the capacitive touch button 10. In the embodiment, the number of the first and second connection terminals 302, 303 are three.

When assembling, fixing the connection terminals 303 on the PCB 400 by solder or another proper manner Fixing the PCB to the lower cover 102 and soldering the electrical protrusions 202 on the inner surface of the circuit board 20 corresponding to the capacitive touch button 10. The buttons of the capacitive touch button 10 are aligned with the electrical protrusions 202, and then the circuit board 20 is mounted on the upper cover 101. Then aligning the electrical protrusions 202 with the first connection terminals 302 of the connection element 30, and fixing the upper cover 101 on the lower cover 102 with screws or hooks (not shown). The first connection terminals 302 are sufficiently connected to the electrical protrusions 202 correspondingly because of the elastic properties of the first connection terminals 302.

During use, once a button of the capacitive touch button 10 is touched, a coupling capacitance is formed between the finger of the user and the sensor electrode 201 corresponding to the touched button. The current generated by the sensor electrode 201 flows through the electrical protrusion 202, the first connection terminal 302 and the second connection terminal 303 in sequence, and is transmitted to the controller (not shown) of the PCB 400. The controller detects the touch coordinate and executes a preset function.

In the embodiment, the connection mechanism 200 for the capacitive touch button 10 of the electronic device 99, includes a cheaper connection element 30 rather than the commonly used connector. Thus, the electronic device 99 is cheaper and easier to assemble.

Although the present disclosure has been specifically described on the basis of the embodiments thereof, the disclosure is not to be construed as being limited thereto. Various changes or modifications may be made to the embodiments without departing from the scope and spirit of the disclosure.

What is claimed is:

1. An electronic device comprising:
    a housing;
    a capacitive touch button secured in the housing and comprising a plurality of button bodies;
    a PCB secured in the housing; and
    a connection mechanism comprising:
        a circuit board secured in the housing and comprising a plurality of sensor electrodes and a plurality of electrical protrusions which are arranged corresponding to the plurality of button bodies of the capacitive touch button, the sensor electrodes being connected to the capacitive touch button and the electrical protrusions; and
        a connecting element comprising a plurality of first connection terminals resisting against the electrical protrusions, and a plurality of second connection terminals fixed on the PCB and connected to the plurality of first connecting terminals, for electrically connecting the capacitive touch button and the PCB.

2. The electronic device as described in claim 1, wherein the connecting element further comprises
    a base,
    and the plurality first connecting terminals are elastically deformed when being pressed.

3. The electronic device as described in claim 2, wherein the first connecting terminals and the second connecting terminals are made of electrically conductive materials.

4. The electronic device as described in claim 1, wherein the plurality of electrical protrusions are metallic solder pads.

5. A connection mechanism for connecting a capacitive touch button of an electronic device with a controller of a PCB of the electronic device, the electronic device comprising a housing, the connection mechanism comprising:
    a circuit board secured in the housing and comprising a plurality of sensor electrodes and a plurality of electrical protrusions which are arranged corresponding to a plurality of button bodies of the capacitive touch button, the sensor electrodes being connected to the capacitive touch button and the electrical protrusions; and
    a connecting element comprising a plurality of first connection terminals resisting against the electrical protrusions, and a plurality of second connection terminals fixed on the PCB and connected to the plurality of first connecting terminals, for electrically connecting the capacitive touch button and the PCB.

6. The connection mechanism as described in claim 5, wherein the connecting element further comprises
    a base,
    and the plurality of first connecting terminals are elastically deformed when being pressed.

7. The connection mechanism as described in claim 6, wherein the first connecting terminals and the second connecting terminals are made of electrically conductive materials.

8. The connection mechanism as described in claim 5, wherein the plurality of electrical protrusions are metallic solder pads.

* * * * *